(12) United States Patent
Barrett et al.

(10) Patent No.: US 7,888,949 B2
(45) Date of Patent: Feb. 15, 2011

(54) ELECTRICAL TESTER SETUP AND CALIBRATION DEVICE

(75) Inventors: Spencer B. Barrett, Beaverton, OR (US); Brandon J. McCurry, Portland, OR (US); Kenneth V. Almonte, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 255 days.

(21) Appl. No.: 12/052,904

(22) Filed: Mar. 21, 2008

(65) Prior Publication Data

US 2009/0237091 A1    Sep. 24, 2009

(51) Int. Cl.
*G01R 35/00*    (2006.01)
(52) U.S. Cl. .................. 324/601; 324/548; 324/424; 209/573; 702/189
(58) Field of Classification Search .................. 324/601
See application file for complete search history.

(56) References Cited

U.S. PATENT DOCUMENTS

| | | | |
|---|---|---|---|
| 4,959,609 A | | 9/1990 | Prokopp et al. |
| 4,975,638 A | | 12/1990 | Evans et al. |
| 5,034,749 A | | 7/1991 | Jungblut et al. |
| 5,718,040 A | | 2/1998 | Faure et al. |
| 5,842,579 A | * | 12/1998 | Garcia et al. ............... 209/573 |
| 6,194,679 B1 | | 2/2001 | Garcia et al. |
| 6,204,464 B1 | | 3/2001 | Garcia et al. |
| 6,898,558 B2 | * | 5/2005 | Klekotka ................. 702/188 |
| 6,906,508 B1 | | 6/2005 | Saulnier et al. |
| 7,119,566 B2 | | 10/2006 | Kim |
| 7,173,432 B2 | * | 2/2007 | Garcia et al. ............... 324/548 |
| 2003/0132754 A1 | * | 7/2003 | Kollmer et al. ............ 324/424 |

FOREIGN PATENT DOCUMENTS

| | | |
|---|---|---|
| JP | 08-292228 | 11/1996 |
| JP | 08-334547 | 12/1996 |
| JP | 2001-349723 A | 12/2001 |
| JP | 2002-008804 A | 1/2002 |

* cited by examiner

*Primary Examiner*—Timothy J Dole
*Assistant Examiner*—Benjamin M Baldridge
(74) *Attorney, Agent, or Firm*—Young Basile

(57) ABSTRACT

An electronic testing machine includes a plurality of test modules. Each test module has a plurality of contact pairs for testing electronic components. An apparatus and process for electrical test setup and calibration of the electronic testing machine includes a plate having at least one contact per track movable between test positions to electrically insert a test device selectively between any one contact pair, and a control program. The test device can be selected from a group consisting of a volt meter, a current meter, a precision voltage/current source, a calibration resistor, and a calibration capacitor. The control program can perform at least one test function through the plate. The test function can be selected from a group consisting of alignment verification, voltage/current source verification, insulation resistance (IR) leakage measurement verification, part-present contact check verification, capacitance and dissipation (CD) measurement verification, IR/CD compensation, and IR/CD calibration.

23 Claims, 5 Drawing Sheets

ELECTRICAL TESTER SETUP AND CALIBRATION DEVICE

FIELD OF THE INVENTION

The present invention relates to an apparatus and method for setup and calibration of an electronic testing machine including a plurality of test modules, where each test module has a plurality of contacts for testing electronic components.

BACKGROUND

The setup and calibration of an electronic testing machine is known to be a difficult and time consuming task. Typically, the setup and calibration process includes one or more of the tasks of contact alignment and verification, voltage source calibration and verification, current source calibration and verification, insulation resistance (IR) leakage measurement calibration and verification, and source and measurement compensation.

Currently it is known to perform alignment verification using software alignment with an upper contact alignment tool that uses a row of parts in a test plate and contact check to automate the alignment measurement, but this tool does not work on passive stations. It is also known to perform source verification by manually using a digital voltage meter (DVM) to measure voltage and current, which is a labor intensive effort since each contact must be manually probed with leads and measurements written down. Wiring is also known to be a major source of faults. It is known to perform measurement verification for leakage by testing the measurement card on the system with a precision resistor to be connected into the cable. This is a time consuming task requiring the precision resistor to be swapped numerous times, by way of example and not limitation, such as 256 times for systems having 64 channels and 4 ranges. The results of the measurements are manually recorded. This does not test the measurement card in isolation, but includes noise and voltage level errors from the source. It is known to perform measurement verification for compensation by manually inserting parts into a test plate, for example in order to perform a part-present contact check verification, or capacitance and dissipation measurement verification (CD). It is known that to perform measurement verification for calibration requires a technician to have access to the electronic testing machine in order to connect test cables and instruments. A port is typically connected to an external computer that performs the calibration. This is a semi automatic task that requires the technician to swap a large number of cables during the calibration sequence.

It would be desirable to provide a quick way to check whether wires are crossed, or in poor condition, or to check for any cable discontinuity in the electronic testing machine. It would be desirable to provide a process for checking the accuracy of the measurement card in isolation. It would be desirable to directly source a current from a National Institute of Standards and Technology (NIST) calibrated "Keithley" source to test the measurement card in isolation.

SUMMARY

An electronic testing machine includes a plurality of test modules. Each test module can be located on angularly spaced radial lines extending from an associated central axis and can have a plurality of contact pairs for testing electronic components. An apparatus and method for electrical test setup and calibration of the electronic testing machine includes a plate having at least one electrode or contact per track movable between test positions to electrically insert a test device selectively between any one contact pair, and a control program. The test device can be selected from a group consisting of a volt meter, a current meter, a precision current source, a precision voltage source, a calibration resistor, and a calibration capacitor. By way of example and not limitation, the calibration resistor can be a NIST traceable resistor or a stable reference resistor, and the calibration capacitor can be a NIST traceable capacitor or a stable reference capacitor. The control program can perform at least one test function through the plate. The test function can be selected from a group consisting of alignment verification, voltage/current source verification, insulation resistance (IR) leakage measurement verification, part-present contact check verification, capacitance and dissipation (CD) measurement verification, IR/CD compensation, and IR/CD calibration.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
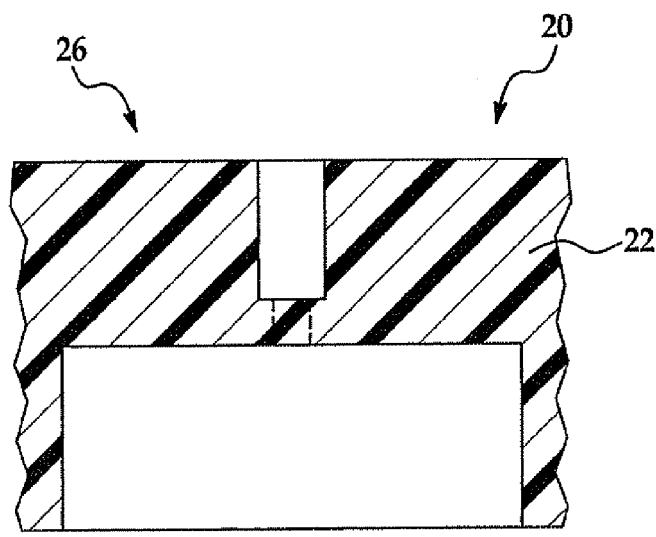
FIG. 1 is a simplified cross sectional detail view of one of a plurality of radial slots cut into a calibration plate or disk.
Figure 2:
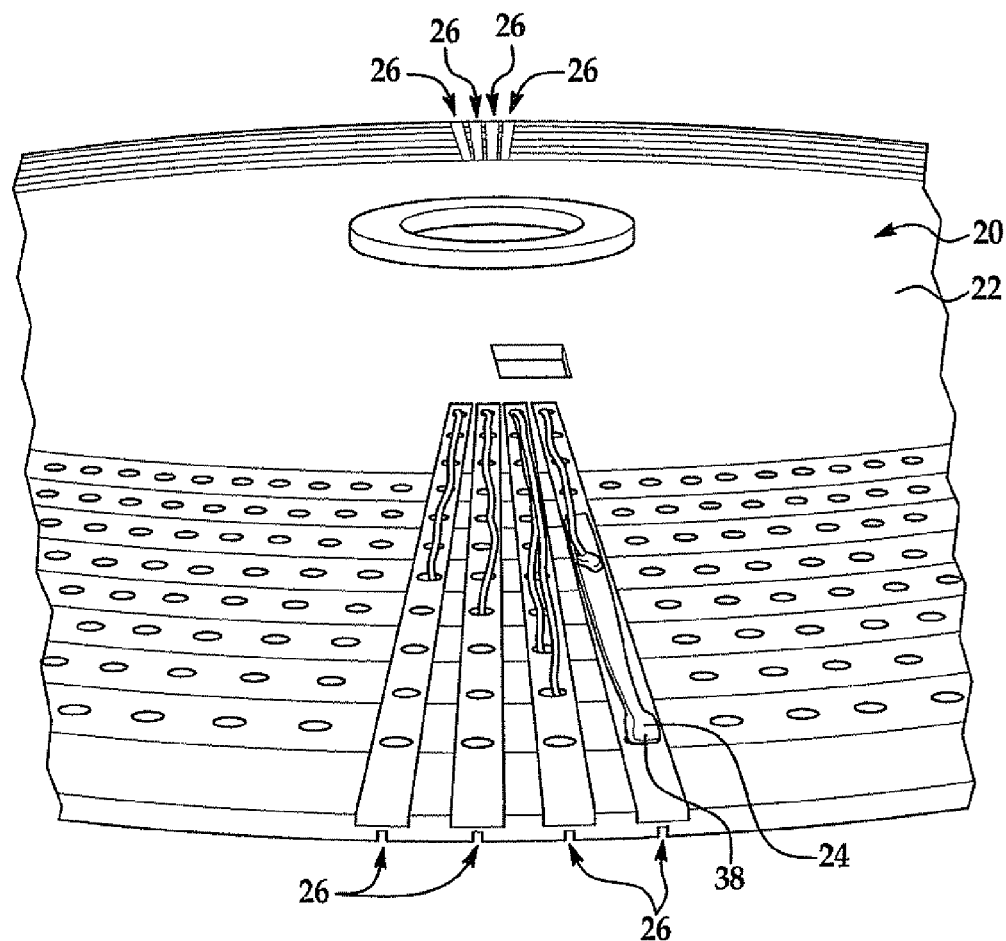
FIG. 2 is a simplified perspective view of a plurality of radial slots cut into the calibration plate or disk, where four radial slots in the foreground test the outer four tracks of the calibration plate or disk and the four radial slots in the background test the inner four tracks of the calibration plate or disk.
Figure 3:
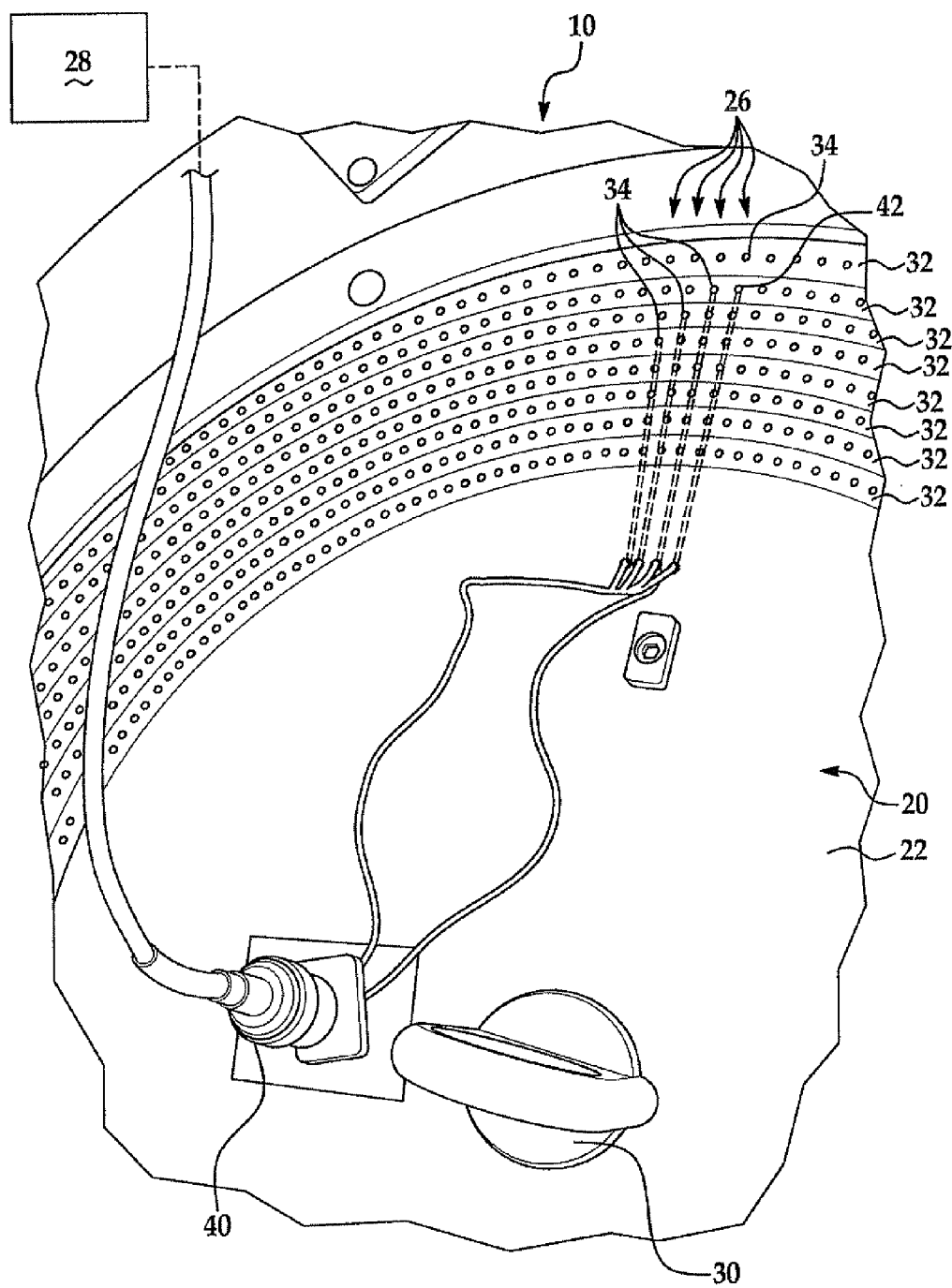
FIG. 3 is a simplified plan view of a top of a calibration plate or disk when mounted in an electronic testing machine, where a coax cable can be used for upper/lower electrode/contact cabling.
Figure 4:
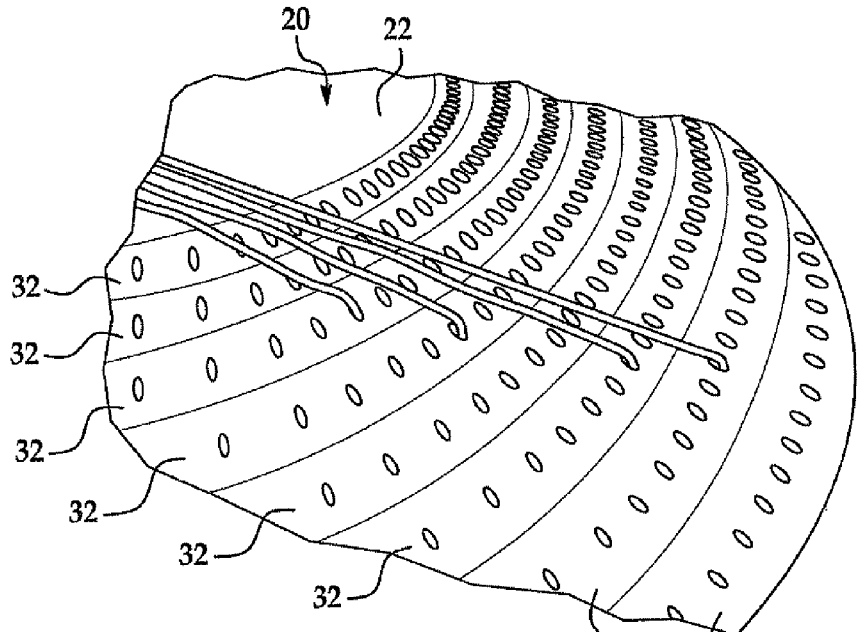
FIG. 4 is a simplified perspective view of a lower electrode/contact, where a compliant electrode/contact protrudes out of the disk to contact a single lower electrode/contact.
Figure 5:
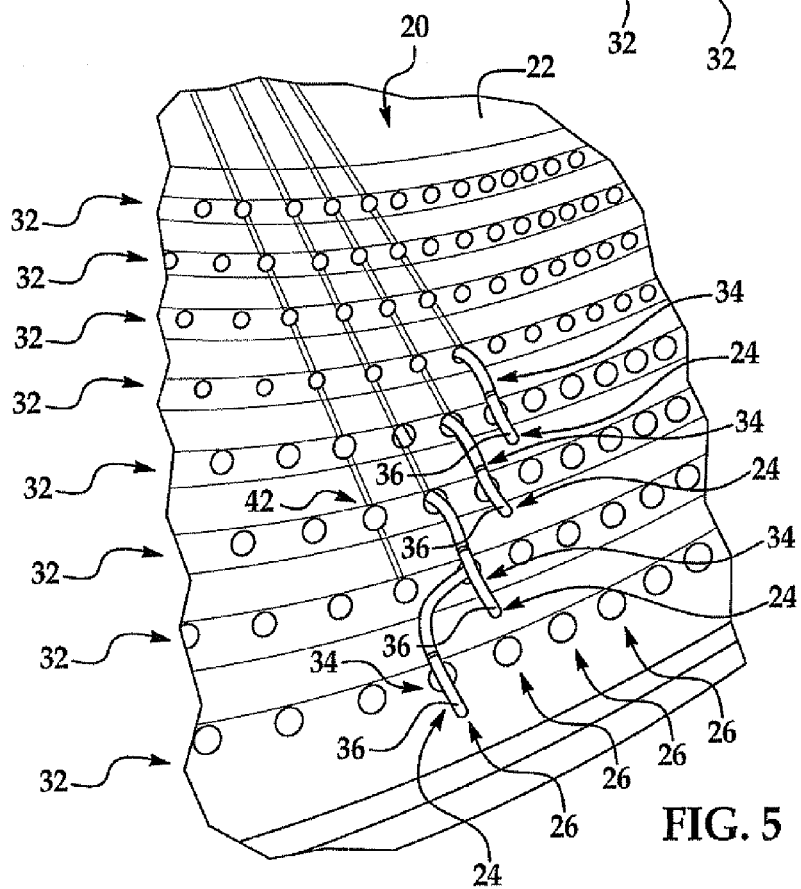
FIG. 5 is a simplified perspective view of an upper electrode/contact, where positioning of the contact is important so the calibration plate or disk can be used for contact alignment testing.
Figure 6:
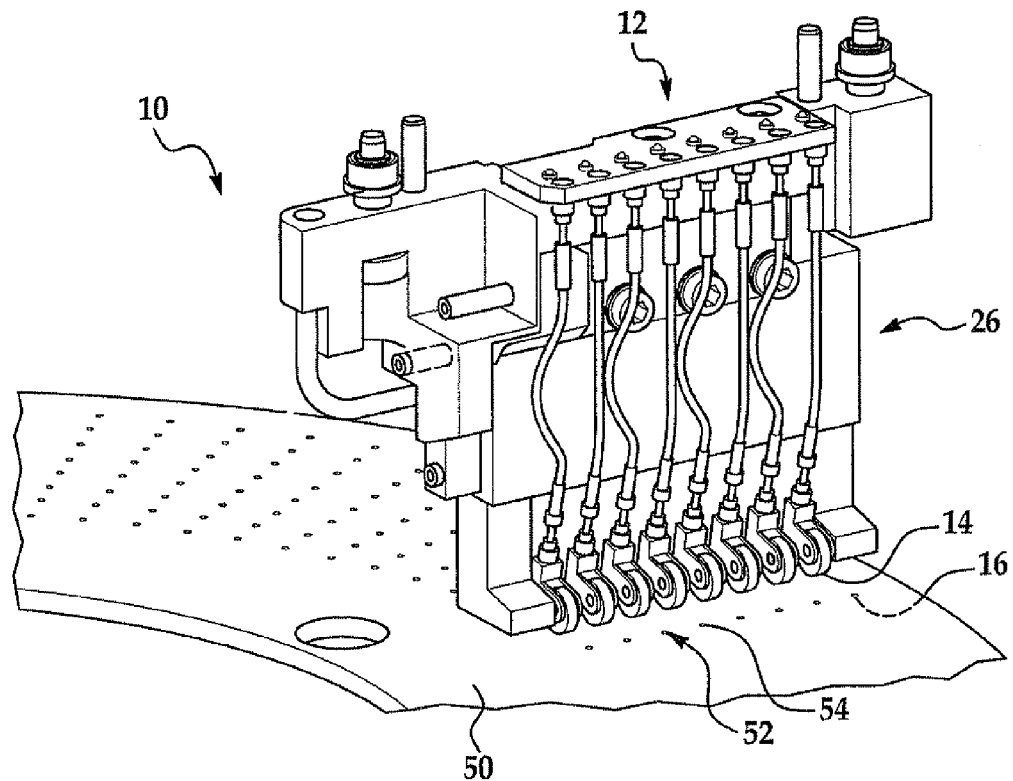
FIG. 6 is a simplified perspective view of an electronic testing machine having at least one test module, each test module having a plurality of contact pairs for testing electronic components carried between test positions by a component test plate.
Figure 7:
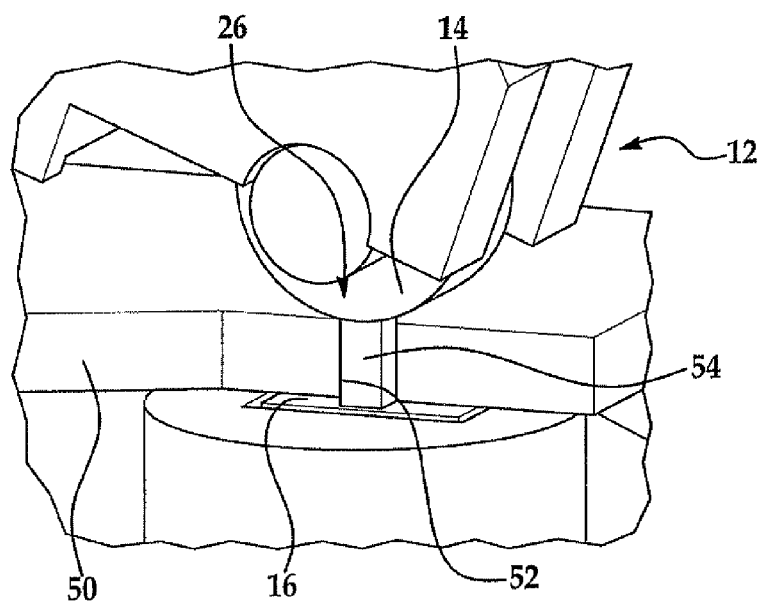
FIG. 7 is a detailed cross sectional perspective view of a production test plate moveable between test positions to electrically insert an electronic component to be tested selectively between an opposing upper and lower contact pair of the electronic testing machine.
Figure 8:
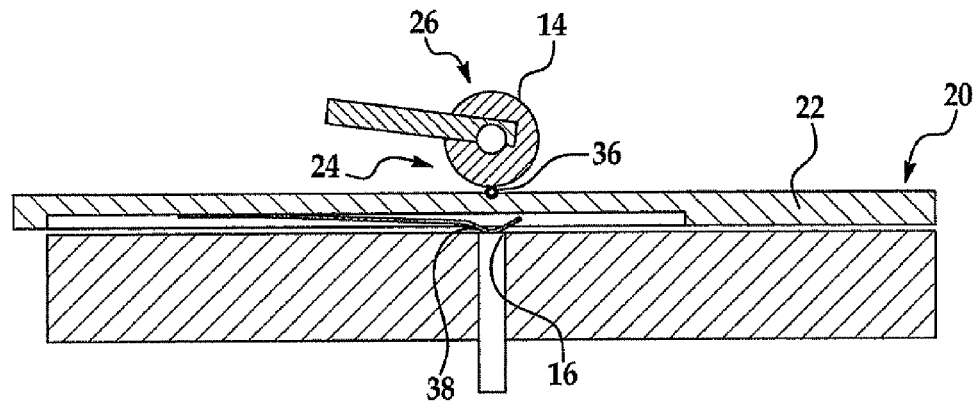
FIG. 8 is a simplified cross sectional view of an electrical test setup and calibration apparatus with a calibration plate or disk mounted thereon having at least one test electrode or contact moveable between test positions to electrically insert a test device selectively between an opposing upper and lower contact pair of the electronic testing machine.

Referring briefly to FIGS. 6 and 7, an electronic testing machine 10 has at least one upper contact 14 and at least one lower contact 16 of a test module 12. Each test module 12 can be located on angularly spaced radial lines extending from an associated central axis and can have a plurality of contact pairs 14, 16 for testing electronic components. A production test plate or disk 50 includes a plurality of pockets 52. Each pocket 52 can carry an electronic component 54 to a test position 26 to be electrically inserted between upper and lower contacts 14, 16 of a test module 12 of the electronic testing machine 12 in order to perform one or more tests on the electronic component. The test plate 50 can be rotated about the central axis to transfer an electronic component 54 to and from a test position 26 associated with corresponding upper and lower contacts 14, 16 of different test modules. It should be understood that the contact pairs 14, 16 can be located to contact on opposite ends of the electric component device 54 to be tested as illustrated in FIGS. 7-8, or can be located to contact on a single side of the electronic component device 54 to be tested depending on the configuration of the electronic component device without departing from the scope of the present disclosure, and that a corresponding calibration plate or disk 22 can be configured to present first and second electrodes 36, 38 on opposite sides of the plate as illustrated in FIGS. 1-5 and 7-8, or can be configured to present first and second electrodes 36, 38 on a single side of the plate depending on the configuration of the contact pairs 14, 16 to be tested.

Referring now to FIGS. 1-5 and 8, an electrical test set up and calibration apparatus 20 can include a calibration plate or disc 22 having at least one test electrode or contact 24 movable between test positions 26 to electrically insert a test device 28 selectively between a contact pair 14, 16 of the electronic testing machine 10. The test device 28 can be selected from a group consisting of a volt meter, a current meter, a precision current source, a precision voltage source, a calibration resistor, and a calibration capacitor. The calibration resistor can be a NIST traceable resistor or a stable reference resistor. The calibration capacitor can be a NIST traceable capacitor or a stable reference capacitor. A control program can perform at least one test function through the plate 22. The test function can be selected from a group consisting of alignment verification, voltage/current source verification, insulation resistance (IR) leakage measurement verification, part-present contact check verification, capacitance and dissipation (CD) measurement verification, IR/CD compensation, and IR/CD calibration. A lookup table can be provided to compensate for offsets introduced by the test device that would limit accuracy. Robustness against track to track variations could help simplify design, manufacture and cost of the device.

The calibration plate 22 can include an axis of rotation coaxially alignable with a center shaft 30 of the electronic testing machine 10 associated with the plurality of test modules 12 for rotation about the axis of rotation to different angular positions. If desired, the calibration plate 22 can be engageable with the center shaft 30 for driving the calibration plate 22 in rotation about an axis to different angular positions in order to selectively align contact pairs 14, 16 sequentially for testing. The at least one test electrode or contact 24 is alignable angularly and radially with contact pairs associated with each test position 26 for each of the plurality of test modules 12 to be tested.

A plurality of tracks 32 can be located on the plate 22. The test electrodes 24 can be spaced at even angular intervals about a rotational axis of the plate 22. The at least one electrode or contact 24 can include a single wired contact 34 associated with each track 32. Each wired contact 34 can include a first electrode 36 and a second electrode 38 electrically isolated from each other. The wired contact 34 can be located on the plate so that only a single wired contact 34 is touching a contact pair 14, 16 of the electronic testing machine 10 to be tested at one time. To reduce electrical interference during testing, four radial slots can be formed on two diametrically opposite sides of the plate 22, where a first set of four slots can test the four tracks 32 of the plate 22, by way of example and not limitation, such as the four outer tracks 32, and the second set of four slots can test the four tracks 32 of the plate 22, by way of example and not limitation, such as the four inner tracks 32.

A connector 40 can be mounted to the plate 22. The first electrodes 36 can be electrically connected to each other and connected to one of the inner and outer conductor of the connector 40. The second electrodes 38 can be electrically connected to each other and connected to the other of the inner and outer conductor of the connector 40. As best seen in the simplified electrical diagram of FIG. 9, the first electrode 36 can be electrically connected to each other and connected to one of the inner and outer conductor of the connector 40. The second electrodes 38 can be electrically connected to each other and connected to the other of the inner and outer conductor of the connector 40 mounted to the calibration plate 22. The connector 40 can connect the first and second electrodes 36, 38 to the test device 28, which can be located external of the electronic component testing machine 10.

By way of example and not limitation, a test station 42 can be located between every fourth wired contact 34, so that there are three wired contacts 34 between test stations 42. When the plate 22 is indexed by the even angular interval the wired contact 34 currently under test is moved out of engagement with a contact pair 14, 16, and another wired contact 34 is moved into engagement with a different contact pair 14, 16 to be tested. The plate 22 can be rotated 360 degrees for testing 200 combined wired contacts 34 and test stations 42.

A method or process for set up and calibration of an electronic component testing machine 10 is disclosed. The electronic testing machine 10 can include a plurality of contacts 14 for test modules 12. Each test module 12 can have a plurality of contact pairs 14, 16 for testing electronic components. The process or method can include positioning the calibration plate 22 for rotational movement to position at least one electrode 24 between test positions 26 to electrically insert a test device 28 selectively between a contact pair 14, 16. The test device 28 can be selected from a group consisting of a volt meter, a current meter, a precision current source, a precision voltage source, a calibration resistor, and a calibration capacitor. The calibration resistor can be a NIST traceable resistor, or a stable reference resistor. The calibration capacitor can be a NIST traceable capacitor, or a stable reference capacitor. The method or process can also include performing at least one test function through the plate 22 with a control program. The test function can be selected from a group consisting of alignment verification, voltage/current source verification, insulation resistance (IR) leakage measurement verification, part-present contact check verification, capacitance and dissipation (CD) measurement verification, IR/CD compensation, and IR/CD calibration. The method or process can include compensating for offsets introduced by the test device that would limit accuracy with a lookup table value. Robustness against track to track variation could help simplify design, manufacture, and cost of the device.

The method or process can include driving the plate 22 in rotation about an axis to different angular positions in order to selectively align contact pairs 14, 16 sequentially with the at least one electrode 24 for testing. The process can align the at least one test electrode 24 angularly and radially with contact pairs 14, 16 associated with each test position 26 for each of the plurality of test modules 12 to be tested. By way of example and not limitation, a total of eight tracks 32 can be formed on the plate 22 with test electrodes 24 spaced every 1.8° at evenly angularly spaced intervals about the rotational axis of the plate 22. The process can include isolating a first electrode 36 and a second electrode 38 electrically from one another on the plate to define a single wired contact 34 associated with each track 32. The wired contact 34 can be located on the plate 22 so that only a single wired contact 34 is touching a contact pair 14, 16 of the electronic test machine 10 to be tested at a time.

Figure 9:
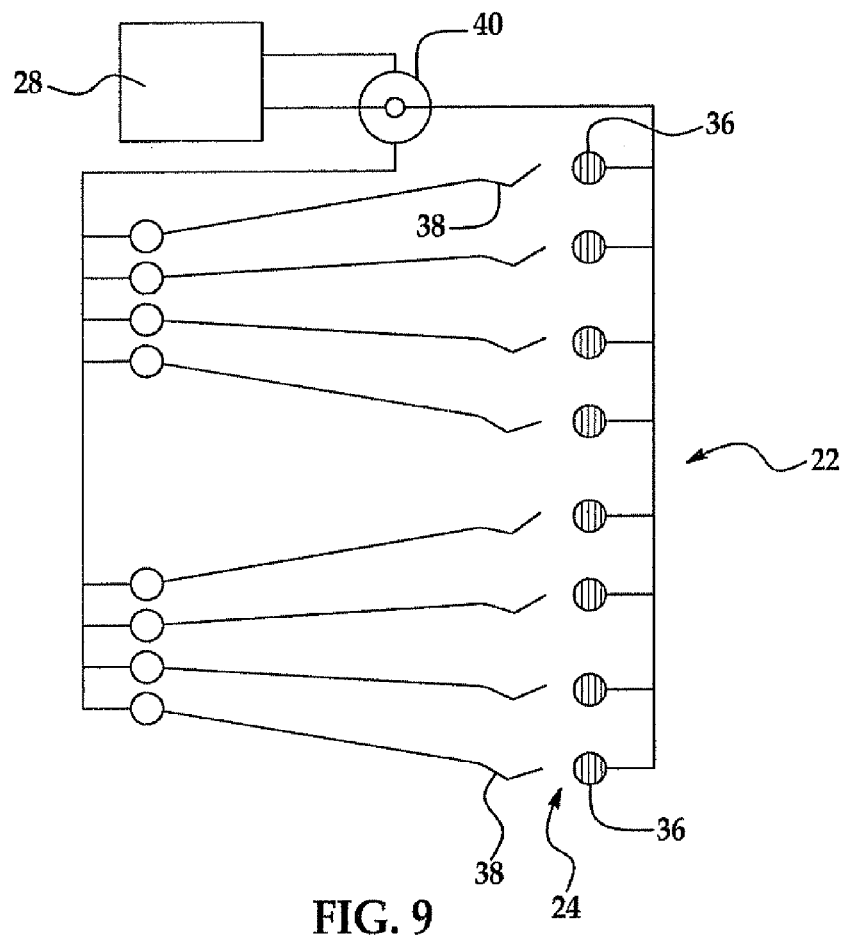
FIG. 9 is a simplified electric diagram illustrating the plurality of test electrodes or contacts moveable between test positions in association with rotation of the calibration plate or disk to electrically insert the test device selectively between an opposing contact pair of the electronic testing machine.

A connector 40 can be mounted to the plate 22. As best seen in FIG. 9, the first electrodes 36 can be electrically connected to each other and connected to one of the inner and outer conductor of the connector 40. The second electrodes 38 can be electrically connected to each other and connected to the other of the inner and outer conductor of the connector 40. By way of example and not limitation, a test station 42 can be located between every fourth wired contact 34 corresponding to 7.2° of rotation, so that there are three wired contacts 34 between test stations 42. The process can include indexing the plate 22 by 1.8°, so that the wired contact 34 currently under test is moved out of engagement with a contact pair 14, 16 and another wired contact 34 is moved into engagement with a different contact pair 14, 16 to be tested. The process of rotating the plate 22 through 360° tests 200 combined wired contacts 34 and test stations 42.

The calibration plate or disk 22 is an electro-mechanical mechanism that provides an automated way to electrically insert a device 28 between any upper/lower (U/L) contact pair 14, 16. The device 28 electrically inserted between upper/lower (U/L) contacts 14, 16 can be selected from a volt meter, a current meter, a precision current source, a precision voltage source, and a calibration resistor, and a calibration capacitor. The calibration resistor can be a NIST traceable resistor, or a stable reference resistor. The calibration capacitor can be a NIST traceable capacitor, or a stable reference capacitor. With the appropriate supporting software, the calibration plate or disk 22 can reduce a week of system checkout into hours. A device 20 according to an embodiment of the present invention can be used for subsystem checkout, calibration, and system/cabling tests. The device 20 according to an embodiment of the present invention can simplify field calibration by using a precision resistor between the upper/lower contacts 14, 16 to calibrate the IR leakage measurement. The device 20 according to an embodiment of the present invention can perform alignment verification with software support. If desired, the software can specify which screw to adjust and by how much it needs to be adjusted. The device 20 according to an embodiment of the invention can perform voltage/current source verification by connecting a NIST traceable current/voltmeter to the bayonet Neill-Concelman (BNC) connector 40, and indexing the plate 360 degrees to individually present each contact pair to the meter. A general purpose interface bus (GPIB) is used to capture data and software outputs results to a spreadsheet. Wiring can be tested with the device 20 according to an embodiment of the present invention by shorting together the inner/outer conductor of the BNC 40, then all channels can be scanned for current draw as the calibration plate or disk 22 rotates to determine if there is a wiring problem. A lookup table can be provided to compensate for offsets introduced by the test device that would limit accuracy. Robustness against track to track variation could help simplify design, manufacture and cost of the device.

Measurement verification can be performed for insulation resistance leakage in two ways. First, a precision resistor or standard cap can be placed on the BNC 40 in electrical communication with a precision voltage source, so that with one end of the precision resistor grounded, automation can be used to verify system insulation resistance (IR) performance. Second, to test the measurements of the measurement (ME) card in isolation, a precision current can be directly sourced from a NIST calibrated "Keithley" source into the ME card. Compensation can be performed based on the values obtained during the measurement verification of the insulation resistance (IR), part-present contact check, and the capacitance and dissipation (CD) measurement verification. The BNC 40 provides an easy way to place a standard cap or precision resistor across the contacts 14, 16. With the right supporting electrical hardware connected to the BNC 40, an open/short/standard compensation can be automated in three rotations of the disk 22. Calibration can be performed based on the values obtained during the measurement verification of the insulation resistance (IR), part-present contact check, and the capacitance and dissipation (CD) measurement verification. Instead of plugging calibration instruments into the back of the electronic component testing machine 10, the test instruments 28 can be directly connected to the disk 22 and reduce the chances for errors or mistakes. A precision resistor can be inserted onto the disk 22 and be used to calibrate the electronic testing machine source and measurement unit. The ability to service, maintain, and calibrate the systems of the electronic testing machine with efficient methods and tools reduces any downtime associated with the electronic testing machine system and the hours of labor associated with performing the task. Alignment can be performed based on the values obtained during contact alignment checking, where the calibration plate 22 can be micro-stepped past the contact 14, 16 to tell when the test electrode 24 is in electrical engagement with a contact 14, 16 of the electronic testing machine 10. The angular position can be recorded and translated into any physical adjustment of the contact 14, 16 required at that particular test station of the electronic testing machine 10.

The present invention in one embodiment is a calibration plate 22 having a predetermined number of tracks 32 and wired electrodes 24, 36, 38 or contacts 34 spaced at a predetermined angular interval. By way of example and not limitation, a total of eight tracks 32 with a wired electrode 36, 38 or contact 34 spaced every 1.8 degrees can be provided, where each track 32 has a single wired electrode 36, 38 or contact 34. In this example, there can be a total of eight wired electrodes 36, 38, defining one contact 34 for each track 32. Each wired electrode 36, 38 location has a first or lower electrode 36 and a second or upper electrode 38 that are electrically isolated from each other. The wired electrodes 36, 38 are placed on the calibration plate 22, such that only a single wired electrode 36, 38 or contact 34 is touching an upper contact 14, 16 of the electronic testing machine 10 at a time. In this example, a BNC connector 40 can be mounted to the calibration plate 22. The eight upper electrodes 38 can be electrically connected to each other, and connected to one of the inner and outer conductor of the BNC 40. The eight lower electrodes 36 can be electrically connected to each other, and connected to the other of the inner and outer conductor of the BNC 40. Automation can be provided according to one embodiment of the invention. By way of example and not limitation, in this example under the upper contact 14, 16, there can be provided a test station every four contacts 34, or every 7.2 degrees, so there are three contacts 34 between test stations. When the calibration plate 22 is indexed 1.8 degrees, the wired electrode 36, 38 or contact 34 currently under test moves out from electrical engagement with a contact 14, 16 of the electronic testing machine 10, and a new wired electrode 36, 38 or contact 34 moves under a different contact 14, 16 of the electronic testing machine 10 and into electrical engagement with the different contact 14, 16 of the electronic testing machine 10. By way of example and not limitation, the calibration plate 22 can be rotated through 360 degrees so that each of the two hundred contacts 14, 16 of an electronic testing machine 10 can be tested.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. In an electronic testing machine having a plurality of test modules located on angularly spaced radial lines extending from an associated central axis, each test module having a plurality of contact pairs for testing electronic components, the improvement of an electrical test setup and calibration apparatus comprising:
   a plate having at least one test electrode mounted to the plate, wherein the plate is movable between test positions to electrically insert a test device selectively between a contact pair of the plurality of contact pairs, the test device selected from a group consisting of a volt meter, a current meter, a precision current source, a precision voltage source, a calibration resistor, and a calibration capacitor; and
   a test machine controller programmed to perform at least one test function through the plate, the test function selected from a group consisting of alignment verification, voltage/current source verification, insulation resistance (IR) leakage measurement verification, part-present contact check verification, capacitance and dissipation (CD) measurement verification, IR/CD compensation, and IR/CD calibration.

2. The improvement of claim 1 further comprising:
   the plate having an axis of rotation coaxially alignable with the central axis associated with the plurality of test modules for rotation about the axis of rotation to different angular positions in order to selectively align the at least one test electrode with different ones of the plurality of contact pairs sequentially for testing.

3. The improvement of claim 1, wherein the at least one test electrode is alignable angularly and radially with the contact pair of the plurality of contact pairs associated with each test position for each of the plurality of test modules to be tested.

4. The improvement of claim 1, further comprising:
   A plurality of tracks located on the plate and the at least one test electrode comprising test electrodes spaced at equal angular intervals about a rotational axis of the plate.

5. The improvement of claim 4 wherein the at least one electrode further comprises:
   a single wired contact associated with each track, each wired contact having a first electrode and second electrode electrically isolated from each other and each wired contact located on the plate so that only a single wired contact is touching a single contact pair of the plurality of contact pairs to be tested at a time.

6. The improvement of claim 5 further comprising:
   a connector mounted to the plate, the first electrodes electrically connected to each other and to an inner conductor of the connector and the second electrodes electrically connected to each other and to an outer conductor of the connector.

7. The improvement of claim 5 further comprising:
   a test station located between every fourth wired contact, so there are three wired contacts between test stations, such that when the plate is indexed by the equal angular interval,
   the wired contact currently under test is moved out of engagement with a contact pair of the plurality of contact pairs, and another wired contact is moved into engagement with a different contact pair of the plurality of contact pairs to be tested.

8. The improvement of claim 7, wherein rotating the plate 360 degrees tests 200 wired contacts/test stations.

9. The improvement of claim 1 further comprising:
   a lookup table to compensate for offsets introduced by the test device.

10. The improvement of claim 1 wherein each of the plurality of contact pairs comprises a first contact and a second contact, the first contact and the second contact electrically isolated from each other; and wherein the electrode contacts one of the first contact and the second contact to complete a circuit with the test device when the plate is in each of the test positions.

11. An apparatus for electrical test setup and calibration of an electronic testing machine having a plurality of test modules located on angularly spaced radial lines extending from an associated central axis, each test module having a plurality of contact pairs for testing electronic components, comprising:
    a plate having one or more radial tracks, wherein an electrode per track is physically coupled to the plate for movement therewith, the plate movable between test positions to electrically insert a test device selectively between a contact pair of the plurality of contact pairs through an electrical connection with the electrode, the test device selected from a group consisting of a volt meter, a current meter, a precision current source, a calibration resistor, and a calibration capacitor; and
    a test machine controller programmed to perform at least one test function through the plate, the test function selected from a group consisting of alignment verification, voltage/current source verification, insulation resistance (IR) leakage measurement verification, part-present contact check verification, capacitance and dissipation (CD) measurement verification, IR/CD compensation, and IR/CD calibration.

12. The apparatus of claim 11 further comprising:
    the plate having an axis of rotation coaxially alignable with the central axis associated with the plurality of test modules for rotation about the axis of rotation to different angular positions in order to selectively align the electrode with different ones of the plurality of contact pairs sequentially for testing.

13. The apparatus of claim 11, wherein the electrode is alignable angularly and radially with the contact pair of the plurality of contact pairs associated with each test position for each of the plurality of test modules to be tested.

14. The apparatus of claim 11, wherein the plate further comprises:
a total of eight tracks located on the plate with test electrodes spaced every 1.8 degrees.

15. The apparatus of claim 14, wherein the electrode further comprises:
a single wire contact associated with each track, each wired contact having a first electrode and second electrode electrically isolated from each other, and each the wired contact is located on the plate so that only a single wired contact is touching a single contact pair of the plurality of contact pairs to be tested at a time.

16. The apparatus of claim 15 further comprising:
a connector mounted to the plate, the eight first electrodes electrically connected to each other and to an inner conductor of the connector and the eight second electrodes electrically connected to each other and to an outer conductor of the connector.

17. The apparatus of claim 15 further comprising:
a test station located between every fourth wired contact corresponding to 7.2 degrees of rotation, so there are three wired contacts between test stations, such that when the plate is indexed by 1.8 degrees, the wired contact currently under test is moved out of engagement with a contact pair of the plurality of contact pairs, and another wired contact is moved into engagement with a different contact pair of the plurality of contact pairs to be tested.

18. The apparatus of claim 11 wherein each electrode of the plate comprises a first electrode and a second electrode electrically isolated from each other and spaced apart by at least a portion of the plate, a spacing between the first electrode and the second electrode such that, when the plate is in one of the test positions, the first electrode is in contact with a first contact of the contact pair and the second electrode is in contact with a second contact of the contact pair.

19. A process for setup and calibration of an electronic testing machine having a plurality of test modules located on angularly spaced radial lines extending from an associated central axis, each test module having a plurality of contact pairs for testing electronic components, the process comprising:
positioning a plate for rotational movement about an axis of rotation relative to the test modules to be tested in order to selectively position at least one electrode at one of a plurality of test positions to electrically insert a test device selectively between a contact pair of the plurality of contact pairs, the at least one electrode physically coupled to the plate for movement therewith;
selecting the test device to be inserted from a group consisting of a volt meter, a current meter, a precision current source, a precision voltage source, a calibration resistor, and a calibration capacitor;
performing at least one test function through the plate with a control program; and
selecting the test function to be performed from a group consisting of alignment verification, voltage/current source verification, insulation resistance (IR) leakage measurement verification, part-present contact check verification, capacitance and dissipation (CD) measurement verification, IR/CD compensation, and IR/CD calibration.

20. The process of claim 19 further comprising:
driving the plate in rotation about the axis of rotation to different angular positions in order to selectively align the at least one electrode with different ones of the plurality of contact pairs sequentially for testing.

21. The process of claim 19 further comprising:
aligning the at least one test electrode angularly and radially with the contact of the plurality of contact pairs associated with each test position for each of the plurality of test modules to be tested.

22. The process of claim 19 wherein the at least one electrode comprises a first electrode and second electrode electrically isolated from each other on the plate by at least a portion of the plate to define a single wired contact associated with each track of the plate, the wired contact located on the plate so that the first electrode and the second electrode of only a single wired contact is respectively touching each contact of a contact pair of the plurality of contact pairs to be tested at a time.

23. The process of claim 19 wherein the plurality of contact pairs comprises a first contact pair and a second contact pair spaced apart in a direction of rotation of the plate, the at least one electrode comprises a first electrode and a second electrode electrically isolation from each other by at least a portion of the plate and the test electrode is electrically coupled to the first electrode and the second electrode, the process further comprising:
moving the plate about the axis of rotation to a first test position where the first electrode is in contact with a contact of the first contact pair and the second electrode is in contact with another contact of the first contact pair so as to complete an electrical circuit with the test device; and
moving the plate about the axis of rotation to a second test position where the first electrode is in contact with a contact of the second contact pair and the second electrode is in contact with another contact of the second contact pair so as to complete an electrical circuit with the test device; and
wherein performing at least one test function through the plate with the control program comprises performing the at least one test function in each of the first test position and the second test position.

* * * * *